United States Patent [19]

Polito et al.

[11] Patent Number: 4,972,189

[45] Date of Patent: Nov. 20, 1990

[54] CORRECTION FOR DC OFFSET IN A/D CONVERTERS

[75] Inventors: Bruno Polito, Woodmere; Juan Adrover, Bronx, both of N.Y.

[73] Assignee: Grumman Aerospace Corporation, Bethpage, N.Y.

[21] Appl. No.: 425,750

[22] Filed: Oct. 23, 1989

[51] Int. Cl.$^5$ .................................. H03K 13/02
[52] U.S. Cl. ............................ 341/118; 341/155; 341/126; 341/165
[58] Field of Search .............. 341/118, 155, 126, 165, 341/163, 120

[56] References Cited

U.S. PATENT DOCUMENTS

| | | | |
|---|---|---|---|
| 407,860 | 6/1878 | Araseki et al. | 341/118 |
| 3,786,491 | 1/1974 | Carleton | 341/118 |
| 3,800,236 | 3/1974 | Riethmuller et al. | 341/118 X |
| 3,889,255 | 6/1975 | Pettersen | 341/118 |
| 4,087,796 | 5/1978 | Brown | 341/165 X |
| 4,140,925 | 2/1979 | Meyer | 341/118 X |
| 4,164,733 | 8/1979 | Landsburg et al. | 341/118 |
| 4,193,066 | 3/1980 | Morrison et al. | 341/118 |
| 4,194,186 | 3/1980 | Morrison et al. | 341/118 |
| 4,228,423 | 10/1980 | Schwerdt | 34/118 |
| 4,229,703 | 10/1980 | Bustin | 341/118 X |
| 4,308,524 | 12/1981 | Harrison et al. | 341/118 X |
| 4,353,060 | 10/1982 | Endoh et al. | 341/118 X |
| 4,590,458 | 5/1986 | Evans et al. | 341/118 |
| 4,647,907 | 3/1987 | Storey | 341/118 |
| 4,771,267 | 9/1988 | Russell, Jr. et al. | 341/118 |
| 4,896,155 | 1/1990 | Craiglow | 341/156 X |

*Primary Examiner*—William M. Shoop, Jr.
*Assistant Examiner*—Sharon D. Logan
*Attorney, Agent, or Firm*—Scully, Scott, Murphy & Presser

[57] ABSTRACT

A means for correction for DC offset in an analog-to-digital converter which utilizes a hardware implemented iterative digital integration process. During the off time of an analog-to-digital converter thermal noise is digitized by the analog-to-digital converter and a specific number of least significant bits which are sufficient to handle the thermal noise levels are accumulated for a given number of samples. The accumulated sum of thermal noise samples is then converted into an analog signal and scaled by the number of samples taken so as to effectively find the average value from the sample collected. This scaled analog signal is then added to the thermal noise input signal wherein the process is repeated a predetermined number of times. Upon completion of the last iteration, the scaled analog signal which is representative of the DC offset inherent in the particular analog-to-digital converter is added to the true analog signal to be digitized.

25 Claims, 4 Drawing Sheets

CORRECTION FOR DC OFFSET IN A/D CONVERTERS

BACKGROUND OF THE INVENTION

1. Field of the Invention

This invention relates to an analog-to-digital converter offset correction means, and more particularly, to a means for the correction of DC offsets inherent in the operation of analog-to-digital converters. The correction for DC offsets in analog-to-digital converters is accomplished with a circuit which utilizes a digital integration process in a negative feedback correction loop.

2. Discussion of the Prior Art

Analog-to-digital converters convert analog signals into digital signals, which are approximations of the original analog signal, by quantizing the analog signal into a predetermined number of discrete levels. There are a variety of analog-to-digital conversion techniques including the successive approximation technique, the integrating technique and the parallel (flash) technique, and in each of these techniques there is an inherent DC offset. The DC offset is a voltage that appears or exists at the output of the analog-to-digital converter at all times. The DC offset arises from the various forms of noise in the surrounding environment of the analog-to-digital converter which effect the internal circuitry of the analog-to-digital converter. The DC offset displaces or biases the digitized output signal by a specific amount and which when coupled with the quantizing approximations, results in an output signal that is not a true representation of the original analog signal waveform In addition, errors in the quantizing approximations are inherent in the conversion process and can only be reduced, not eliminated, by increasing the resolution of the analog-to-digital converter. However, the DC offset, while inherent in any type of electrical circuitry, can be essentially eliminated in order to provide accurate digitized signal waveforms.

There are two fundamental approaches to the correction of DC offset in analog-to-digital converters; namely, a software approach and a hardware approach. The software approach requires a processor to compute the DC offset, which utilizes valuable processing time. The hardware approach avoids the need to tie up valuable processing time and requires approximately 1000 times less time than the software correction approach requires. In the patent art, there are numerous examples of hardware implementations for the correction for DC offsets in analog-to-digital converters.

U.S. Pat. No. 4,228,423 to Schwerdt discloses an offset correction apparatus for a successive approximation analog-to-digital converter. This disclosure specifically deals with the DC offset correction in analog-to-digital converters which contain internal digital-to-analog converters. In addition, the invention requires internal modifications to the analog-to-digital converter as well as two external timing signals to control the operation of the offset correction circuit.

U.S. Pat. No. 4,308,524 to Harrison et al. discloses a fast high resolution predictive analog-to-digital converter with error correction. This invention provides for the improved resolution of a fast analog-to-digital converter and the reduction of error of sample and hold amplifiers. Data correction values are updated and applied on a sample to sample basis, and occurs simultaneously with the actual data conversion. The corrections are calculated by subtracting the previous sample value from the current sample. This method for correction will cause erroneous results when the analog signal is rapidly varying in amplitude.

U.S. Pat. No. 4,097,860 to Araseki et al. discloses an offset compensating circuit. The method employed requires that a preset offset level be reached before compensation is applied and in order to set the preset level, a prior knowledge of the input signal levels as well as the converter characteristics is needed. The compensation is not exact because it is either zero or the preset level.

U.S. Pat. No. 4,590,458 to Evans et al. discloses a system for reducing offset in an analog to digital conversion system. The DC offset correction is achieved by adding or subtacting from a counter. The decision to add or subtract is made by sampling the grounded input between conversions The sign bit of this sample determines the addition or subtraction of one count. Some time is required after initial turn on for the DC offset correction value to reach a steady state level. There will be a similar time delay whenever the DC offset changes rapidly with time.

SUMMARY OF THE INVENTION

The present invention is directed to a means for correction for DC offset in an analog-to-digital converter when the analog-to-digital converter is not being utilized for signal conversion. The method employed in the present invention is a digital integration method for the fast, continuous correction for DC offset in the analog-to-digital converter. The digital integration method for obtaining the DC offset for an analog-to-digital converter requires that the only input to the analog-to-digital converter during the correction operation is thermal noise. For the purposes of this application it is assumed that the mean value of the thermal noise is zero, and the result of the integration of this signal is the DC offset. This DC offset is then added to an input signal that is to be digitized upon the receipt of an external command signal referred to as the calibrate control signal, thus yielding correct analog-to-digital conversion.

The basic operation of the system employed for the correction for DC offset in analog-to-digital converters is an iterative or cyclic approach which is implemented in a correction loop circuit. A switching means is operable to switch the system between a correction mode of operation and a normal operation mode. During the non-sampling time for an analog-to-digital converter, a calibrate control signal actuates a first switching means to provide a thermal noise calibration signal to the input of the analog-to-digital converter. The analog-to-digital converter converts the thermal noise calibration signal into an n-bit digital output signal. A predetermined number of least significant bits of the n-bit output are routed to an accumulating means. The accumulating means is an m-bit accumulator which is run off of a timing pulse supplied by a system clock that runs at the same rate as the analog-to-digital converter, thereby effectively synchronizing the m-bit accumulator with the analog-to-digital converter. The m-bit accumulator adds a predetermined number of samples of the predetermined number of least significant bits in a predetermined sampling period as governed by the sampling rate of the analog-to-digital converter. The count of the predetermined number of samples is kept by a counter means which is also run off the timing pulse supplied by the system clock. Upon the completion o±a single sampling period, the counter means outputs a shift pulse which causes the m-bit accumulator to output an m-bit sum to an accumulating digital-to-analog converter wherein the m-bit sum is converted into an analog correction signal. The analog correction signal is then routed to an inversion means The inversion means is an inverting amplifier with a gain chosen to be equal to one over the predetermined number of samples in a sampling period thereby providing the averaging function needed in the correction loop. The output of the inverter is the DC offset correction signal which is summed with the thermal noise calibration signal to complete the first iteration of the correction loop. Upon completion of a predetermined number of iterations through the above described correction loop, a final DC offset correction signal is summed with an input signal which is to be digitized thereby correcting for the DC offset of the analog-to-digital converter.

The present invention provides an automated digital technique that enables fast, continuous DC offset correction for the DC offset inherent in analog-to-digital converters. The present invention also provides for the independent DC offset correction for each channel of a multi-channel analog-to-digital converter system and does so continuously during the analog-to-digital conversion off time. Successive iterations through the correction loop serve to eliminate errors that arise in other hardware components utilized in the system. The present invention utilizes a hardware approach for the correction for DC offset in analog-to-digital converters that avoids the need to tie up the valuable processing time of the system central processing unit that would be required if a software correction approach was implemented. The present invention is approximately 1000 times faster than a software implementation. The circuitry for the hardware correction of the present invention can be built using common low cost integrated circuits.

The present invention is uniquely different from the invention disclosed in U.S. Pat. No. 4,228,423 in that it is applicable to all types of analog-to-digital converters, it may be implemented without circuitry changes internal to the analog-to-digital converter and it requires only a single external timing signal to control the correction circuit. The present invention provides for continuous DC offset correction during signal conversion time utilizing the most current correction value which is calculated by taking an average of the thermal noise signals entering the analog-to-digital converter as opposed to the method disclosed in U.S. Pat. No. 4,308,524. The present invention also provides a calculated offset level which is accurate and is adaptable to changing conditions that occur as time progresses as opposed to the invention disclosed in U.S. Pat. No. 4,097,860.

The means for correction for DC offset in an analog-to-digital converter can be used in a wide variety of commercial and military applications. The means for correction of the present invention can be used in all civil and commercial systems employing analog-to-digital converters such as the increasingly popular digital audio and digital video systems available today. The present invention can be used in commercial as well as military aerospace systems including avionics and radar systems which depend on accurate analog-to-digital conversion.

DESCRIPTION OF THE PREFERRED EMBODIMENT

In radar systems, such as a Moving Target Indication (MTI) system, a great deal of digital signal processing is required. This type of digital signal processing requires two channels, each using analog-to-digital converters. One channel is denoted I for in phase channel and one is denoted Q for quadrature channel since a 90 degree phase difference is present. The DC offset that is produced by the I and Q channel analog-to-digital converters can be removed by a digital integration process.

Figure 1:
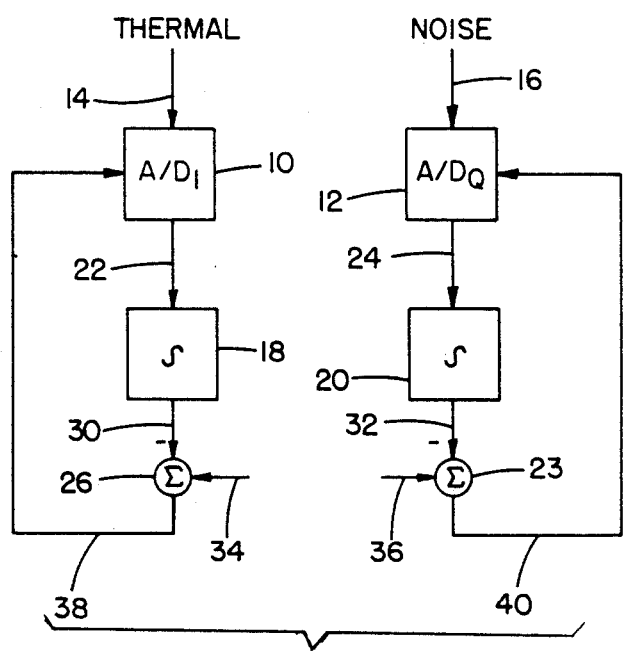
FIG. 1 is a block diagram representation of the general DC offset correction approach of the present invention.

Referring to FIG. 1, there is shown a block diagram illustrating the general DC offset correction approach implemented in a single pair of I and Q channels of a MTI radar system. The digital integration process for obtaining the DC offset requires that the only input to the analog-to-digital converters 10 and 12 during the correction time be thermal noise. Since the mean value of the thermal noise is zero, the result of the integration process would be the DC offset. The thermal noise is introduced into the analog-to-digital converters 10 and 12 of the I and Q channels via input lines 14 and 16 respectively. The outputs of analog-to-digital converters 10 and 12 are the digitized representation of the thermal noise inputs and are directed to integration process blocks 18 and 20 via signal lines 22 and 24. The outputs of the integration process blocks 18 and 20 are the DC offset values as stated above. The DC offset values are directed to summing circuits 26 and 28 via signal lines 30 and 32. The DC offset values are then summed with the analog signals, carried on lines 34 and 36, which are to be digitized. The outputs of the summing circuits 26 and 28 represent the analog signals to be digitized with the DC offset signals added in and therefore the analog signals can be digitized by analog-to-digital converters 10 and 12 with the DC offset corrected for, yielding correct analog-to-digital conversion. Signal lines 38 and 40 carry the DC offset corrected analog input signals to the analog-to-digital converters 10 and 12.

Figure 2:
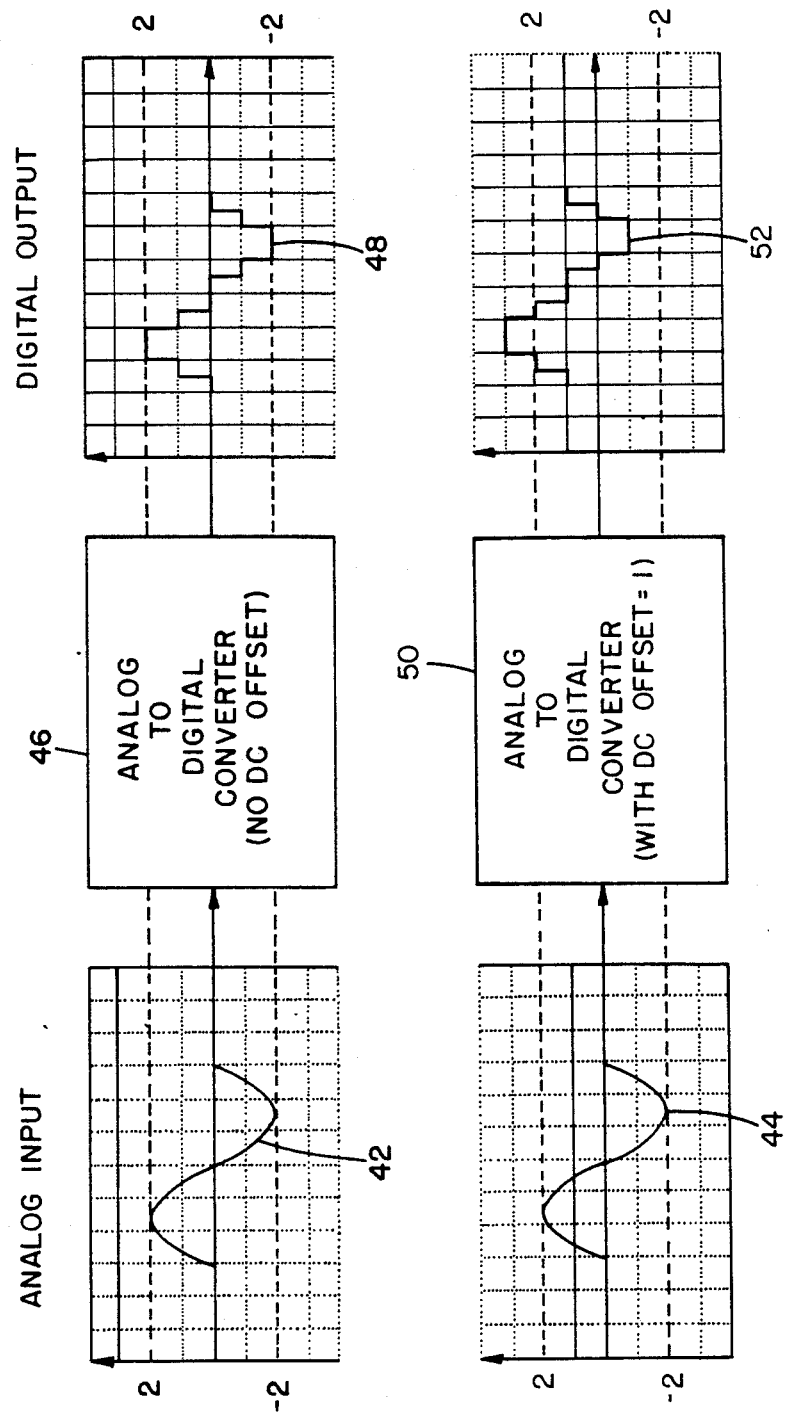
FIG. 2 is a graphic representation of an analog signal digitized by an analog-to-digital converter with no DC offset and one digitized by an analog-to-digital converter with DC offset.

FIG. 2 illustrates a pair of analog input signals 42 and 44, shown as sine waves with an amplitude range of −2.0 to +2.0. Sine wave 42 is directed to an analog-to-digital converter 46 having correction for DC offset. The digitized output waveform 48 is shown with a mean amplitude range of −2.0 to +2.0. Sine wave 44 is directed to an analog-to-digital converter 50 having a DC offset equal to +1.0. The digitized output waveform 52 is shown with an amplitude range of −1.0 to +3.0 and thus is not a true quantized representation of the original sine wave 44. FIG. 2 illustrates the problems associated with DC offset in analog-to-digital inverters and the need for correction for DC offset in analog-to-digital converter circuits.

Figure 3:
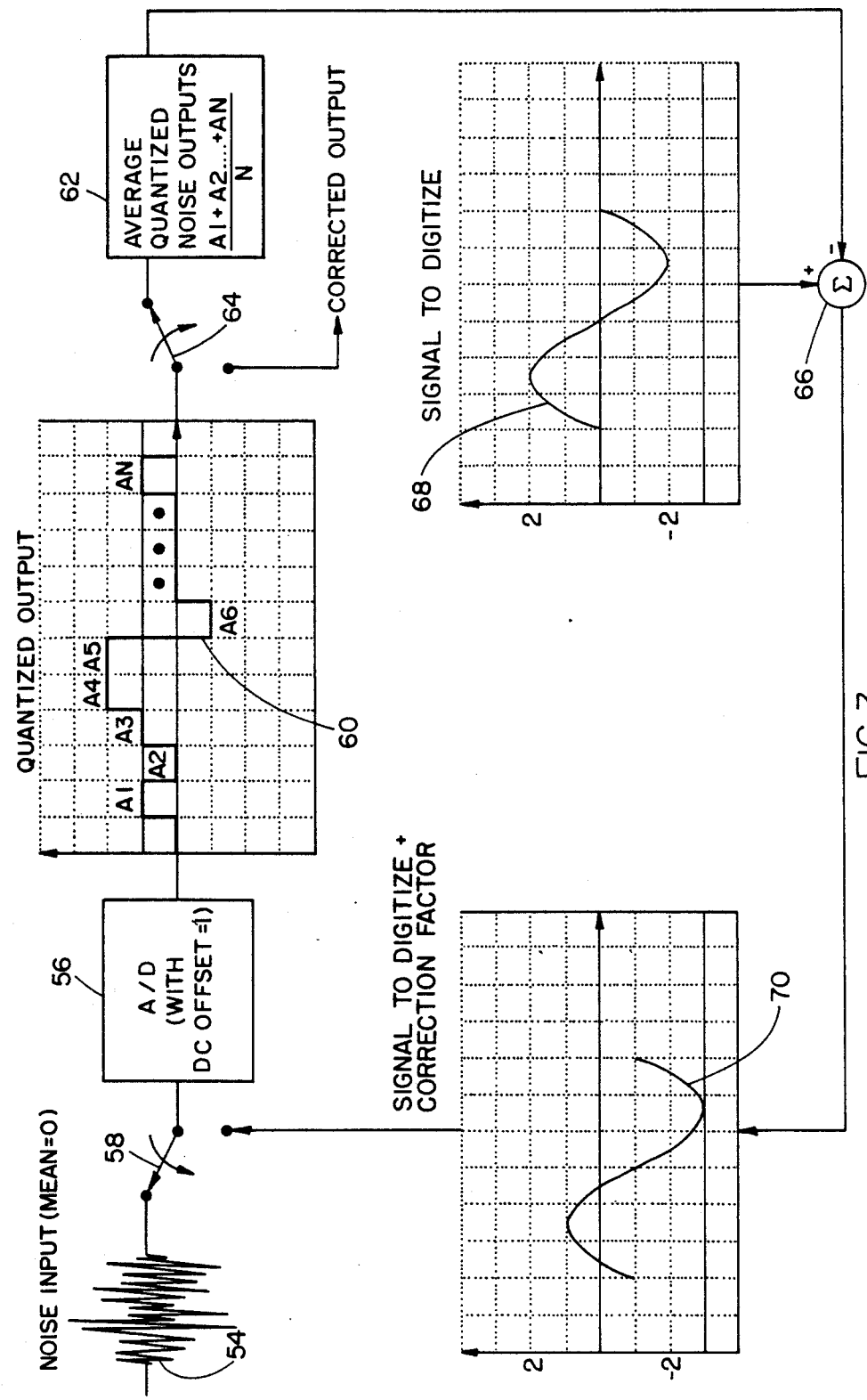
FIG. 3 is a graphic illustration of the feedback solution utilized by the present invention.

Referring now to FIG. 3, there is shown a representation of the negative feedback loop or correction loop solution for correction for DC offset in analog-to-digital converters. Thermal noise signal 54 with zero mean is input into an analog-to-digital converter 56 through a first switching means 58. The quantized noise output 60 of analog-to-digital converter 56 is then input into an averaging means 62 through a second switching means 64 The averaging means 62 digitally accumulates the quantized noise outputs 60 and then divides the sum by the number of samples taken resulting in an average quantized noise value which is ultimately represented as an analog DC signal. The analog DC signal is then directed to a summing means 66. If it is desired to perform successive iterations in the correction loop, the signal to digitize 68 is not summed with the analog imput signal, but rather, the analog DC signal is added as an offset or bias to the thermal noise signal 54 by means of the first switching means 58. The biased or DC offset corrected thermal noise calibration signal is once again passed through the analog-to-digital converter 56 and the entire correction loop is traversed again. This process continues for any desired amount of iterations As was stated previously, successive iterations of the control loop will decrease the effect of inaccuracies due to other system components. Upon completion of the desired number of iterations, the analog signal to digitize is added to the analog DC offset correction signal, which is then referred to as the DC offset corrected analog input signal, by summing means 66. The signal to digitize plus the DC correction signal 70 is then fed into the analog-to-digital converter 56 by switching means 58.

Figure 4:
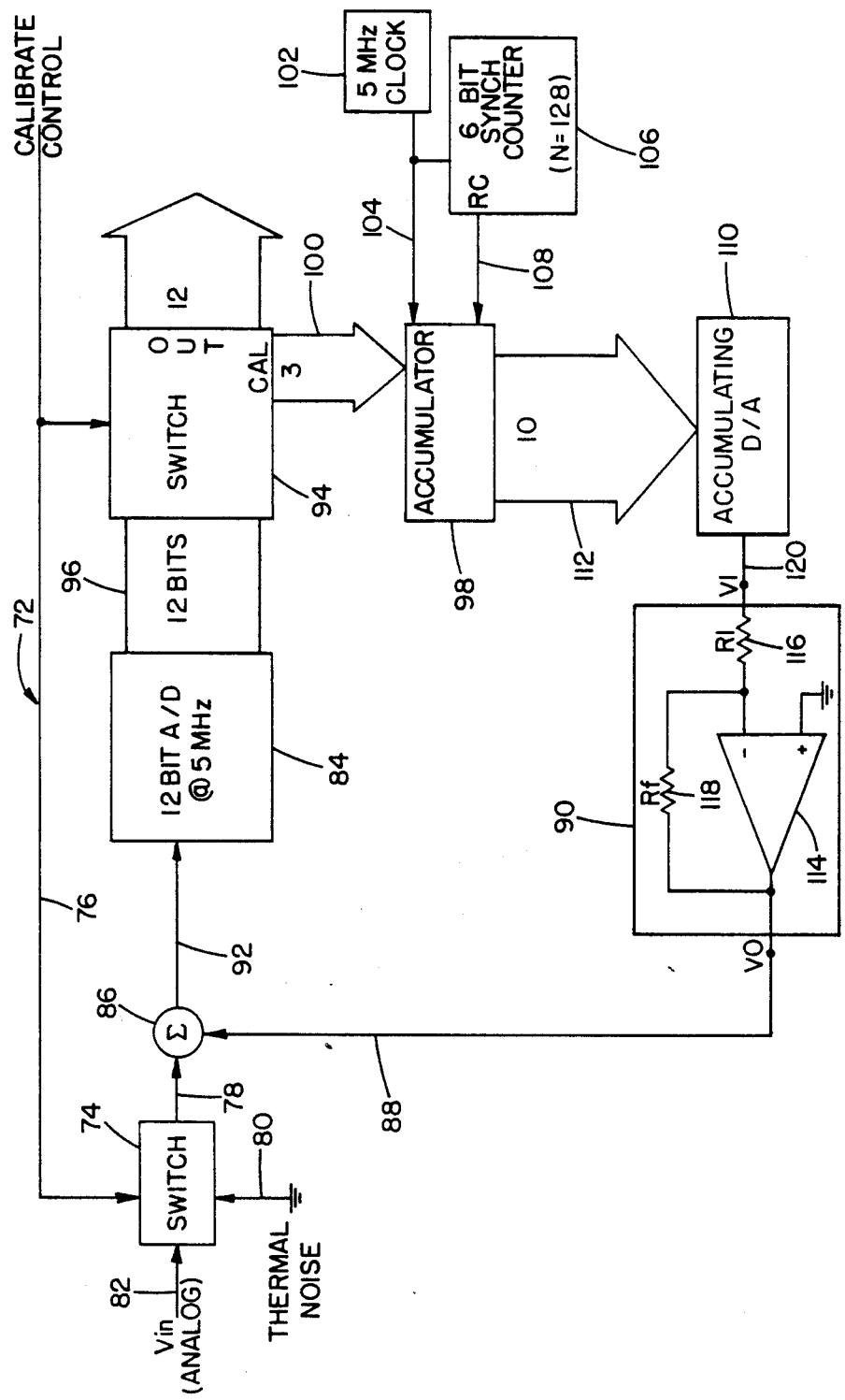
FIG. 4 is a block diagram representation of the hardware implementation of the means for correction for DC offset in analog-to-digital converters of the present invention.

FIG. 4 is a block diagram representation of the hardware implementation of the means for the correction for DC offset in analog-to-digital converters. The correction loop circuit 72, shown in FIG. 4, has two modes of operation; namely, a calibration mode and a normal operation mode. A calibrate control signal from the host system (not shown) controls the operation of a first switching means 74 which is a controllable single pole, double throw analog switch. The calibrate control signal, which is transferred into the analog switch 74 through signal line 76, causes the analog switch 74 to switch from an analog signal input position to a grounded input position. In the grounded input position, the only signal leaving the analog switch 74 is a thermal noise calibration signal through output line 78. The thermal noise calibration signal is brought into the analog switch 74 via a grounded input line 80. In the calibrate mode of operation, the analog switch 74 inhibits an analog signal input, carried by input line 82, from entering the circuit 72. The transmission of the calibrate control signal from the host system to the analog switch 74 indicates that the analog-to-digital converter 84 is not presently needed and it is safe to enter the calibration mode of operation.

The output of the analog switch 74 is directed into a summing means 86 by means of output line 78. A second input into the summing means 86 is from the output signal line 88 from the inversion means 90 which will be discussed subsequently. For the purposes of this explanation, it is assumed that this is the first iteration through the loop and thus the summing means 86 has only one non-zero input; namely, the output of the analog switch 74. The output of the summing means 86 is directed to the input of the analog-to-digital converter 84 through signal line 92. In this embodiment, the analog-to-digital converter 84 is a 12-bit analog-to-digital converter running at 5 MHz. It should be noted that the analog-to-digital converter can be an n-bit analog-to-digital converter where n is equal to any number currently available. As is stated above, the only signal exiting the summing means 86 is the output of the analog switch 74 which is the thermal noise calibration signal This thermal noise calibration signal is digitized by the analog-to-digital converter 84 and a 12-bit output is provided to a second switching means 94 by means of a bus 96.

The second switching means 94 is a digital switch that can be switched between an output mode position and a calibration mode position by means of the calibrate control signal. Upon receipt of the calibrate control signal, the digital switch 94 is switched into the calibrate control mode position and m-bits of the 12-bit output of the analog-to-digital converter 94 are outputed to an accumulating means 98 by means of bus 100. These m-bits represent a predetermined number of least significant bits from the 12-bit output. In this embodiment of the invention, m was chosen to be equal to 3 so as to accurately and fully represent the thermal noise calibration signal levels. The 3-bit signal as stated above is comprised of the 3 least significant bits of the 12-bit output of the analog-to-digital converter 84.

The accumulating means 98 is a 10-bit accumulator because for purposes of this example 128 samples of the digitized noise signal was chosen for each iteration through the control loop and to represent the 128 summations of 3 bits each requires 10 bits. The accumulator 98 is synchronized with the analog-to-digital converter 84 by means of a system clock 102 which is a 5 MHz clock. The clock signal or timing pulse from the system clock 102 is provided by timing line 104. The accumulator 98 is responsible for the digital accumulation of the desired number of samples (128) of the least significant bits (3) of the digitized noise sample. The accumulator 98 receives an input from a counter means 106 when the desired number of samples is accumulated. The counter means is a 6-bit synchronous counter which provides a shift pulse to the accumulator 98 when the counter 106 achieves a count of 128 as determined by the timing pulses from the system clock 102. The shift pulse is transmitted through signal line 108. Upon receiving the shift pulse, the accumulator shifts its 10-bit sum into an accumulating digital-to-analog converter 110 via bus 112. The accumulating digital-to-analog converter 110 automatically converts the 10-bit sum into an analog signal representation of the digital 10-bit sum.

The analog signal is a DC signal which is then input into an inversion means 90. The inversion means 90 is an inverting amplifier 114 with input resistance 116, $R_i$, and feedback resistance 118, $R_f$. The analog signal is input into the inverting amplifier 114 through input resistor 116 and into the inverting terminal of the amplifier 114 through line 120. The purpose of the inverting amplifier 114 is to cause a polarity change in the analog signal such that if it were positively valued it would be output as negatively valued and vise versa. The reason for this polarity inversion is due to the nature of negative feedback systems The idea in a negative feedback system is to reduce the error between the actual output and the desired output of a system. In this invention, the idea is to generate a DC offset correction signal which when added to an analog input signal to digitize results in zero offset error in the amplitude of the digitized waveform. Thus if a positive signal enters summing means 86 through line 78, the signal entering summing means 86 through line 88, which carries the output of inverting amplifier 114, should tend to reduce or eliminate the error or difference between the two signals and this can only be done if the output of the inverting amplifier 114 is of the opposite polarity of the signal on line 78. The second purpose of inversion means 90 is to scale the output of the accumulating digital-to-analog converter 110. Recalling that the entire correction process is a digital integration process, it is seen that up till this point, only a summation of 128 samples of the thermal noise is taken and in order to mimic true numerical integration an average is needed; therefore, the gain, G, of the inverting amplifier 114, which is given by $$G = R_f/R_i, \qquad (1)$$

is chosen such that its value is equal to one over the number of samples summed in one sampling period thereby resulting in a division of the sum by the number of samples that are in the sum which results in a true average value. Since there are 128 samples in the sum, the gain G is given by $$G = 1/128 \qquad (2)$$

In this example, three iterations through the calibration loop was chosen; therefore, the scaled output of the inverting amplifier 114 which is a DC offset correction signal is summed with the thermal noise calibration signal at the summing means 86 resulting in a DC offset corrected thermal noise calibration signal which is now ready to traverse the correction loop once again thereby repeating the above described process. This DC offset corrected thermal noise calibration signal has already been corrected or biased by the DC correction signal generated by the first iteration through the loop and each subsequent iteration refines the DC offset correction signal by means of the negative feedback principle. In addition to the error reducing effects from negative feedback, the accumulating digital-to-analog converter 110 aids in the refinement process. The accumulating digital-to-analog converter 110 on the second and subsequent iterations retains the previous sum that was digitized and continuously adds them up. Since the overall loop is a negative feedback loop, subsequent iterations through the loop result in smaller and smaller amplitude thermal noise calibration signals which results in smaller sums from the accumulator 98. Therefore, the running sum in the accumulating digital-to-analog converter 110 will level off as further iterations of the loop are done, and thus the DC offset correction signal will also level off.

Upon completion of the third iteration through the loop, the calibrate control signal is removed and the analog switch 74 switches to the signal input position thereby allowing the analog signal to be digitized to be summed with the final DC offset correction signal resulting in a DC offset corrected analog input signal to be digitized. The DC offset corrected analog input signal is passed through the analog-to-digital converter 84 and converted into a 12-bit digitized signal. The 12-bit signal is then routed to the digital switch 94 which upon the removal of the calibrate control signal is now in the output mode position. In the output mode position, the digital switch 94 outputs all 12-bits to a means for further processing which is not shown.

The means for the correction for the DC offset correction in analog-to-digital converters requires a time given by $$T_{DC} = (1/F_s)(N_s)(N1) \; sec \qquad (3)$$

to obtain the DC offset correction signal, where Fs is the sampling rate of the analog to digital converter, Ns is the number of samples taken, and N1 is the number of times the calibration loop is traversed. Utilizing the aforementioned numbers; namely, 5 MHz for Fs, 128 samples for Ns and 3 iterations for N1 and plugging them into equation 3 results in $$T_{DC} = 76.8 \; ns \qquad (4)$$

Thus one can see the fast response of this type of correction loop.

All elements in the correction loop are standard integrated electronics components. The 12-bit analog-to-digital converter 84 can be any n-bit converter, the 10-bit accumulator 98 can be any p-bit accumulator and the accumulating digital-to-analog converter 110 must be the same size as or bigger than the accumulator 98.

Although shown and described in what are believed to be the most practical and preferred embodiments, it is apparent that departures from specific methods and designs described and shown will suggest themselves to those skilled in the art and may be used without departing from the spirit and scope of the invention. The present invention is not restricted to the particular constructions described and illustrated, but should be constructed to cohere of all modifications that may fall within the scope of the appended claims.

What is claimed is:

1. A means for correction for DC offset in an analog-to-digital converter when said analog-to-digital converter is not needed for signal conversion, said means comprising:
   (a) a switching means operable to switch said means for correction between correction mode of operating and a normal operation mode;
   (b) an accumulating means for the digital accumulation of a predetermined number of least significant bits from an n-bit output of said analog-to-digital converter when said switching means switches said means for correction into said correction mode of operation which results in an m-bit sum accumulated for a predetermined number of samples, a counter means being operable to maintain said predetermined number of samples;
   (c) an accumulating digital-to-analog converter which converts said m-bit sum from said accumulating means into an analog correction signal; and
   (d) an inversion means which inverts the polarity of said analog correction signal from said accumulating digital-to-analog converter to derive a DC offset correction signal.

2. The means for correction for DC offset according to claim 1 wherein said switching means comprises:
   (a) a first switching means operable to switch between a signal input position and a grounded input position, said switching means having an output connected to a summing means;
   (b) a second switching means operable to switch an n-bit output of said analog-to-digital converter between an output mode position and a calibration mode position;

(c) an accumulating means for the digital accumulation of a predetermined number of least significant bits from said n-bit output of said analog-to-digital converter when said switching means is in the calibration mode position, which results in an m-bit sum;

(d) a counter means operable to maintain a count of a predetermined number of samples being accumulated by said accumulating means;

(e) an accumulating digital-to-analog converter which converts said m-bit sum from said accumulating means into an analog correction signal; and (f) an inversion means which inverts the polarity of said analog correction signal from said accumulating digital-to-analog converter to derive a DC offset correction signal.

3. The means for correction for DC offset according to claim 2 wherein said first switching means switches between said signal input position and said grounded input position upon receipt of a calibrate control signal.

4. The means for correction for DC offset according to claim 3 wherein said first switching means selects an analog input signal for said analog-to-digital converter when said switching means is in said signal input position and selects a thermal noise calibrate signal for said analog-to-digital converter when said switching means is in said grounded input position.

5. The means for correction for DC offset according to claim 4 wherein said first switching means is a controllable single pole, double throw analog switch.

6. The means for correction for DC offset according to claim 4 wherein said second switching means switches between said output mode position and said calibration mode position upon receipt of said calibrate control signal.

7. The means for correction for DC offset according to claim 6 wherein said second switching means diverts said n-bit output of said analog-to-digital converter to a processing means when said second switching means is in said output mode position and diverts said predetermined number of least significant bits from said n-bit output to said accumulating means when said second switching means is in said calibration mode position.

8. The means for correction for DC offset according to claim 7 wherein said second switching means is a digital switch.

9. The means for correction for DC offset according to claim 7 wherein said accumulating means is a m-bit accumulator operable for summing said predetermined number of samples of said predetermined number of least significant bits in a predetermined sampling period resulting in said m-bit sum, said m-bit accumulator is synchronized with said analog-to-digital converter by means of a timing pulse supplied from a system clock, said system clock running at the same rate as said analog-to-digital converter.

10. The means for correction for DC offset according to claim 9 wherein said counter means is synchronized with said m-bit accumulator by means of said timing pulse supplied from said system clock, said counter means is a p-bit synchronous counter whereupon reaching a count equal to said predetermined number of samples said p-bit synchronous counter sends a shift pulse to said m-bit accumulator.

11. The means for correction for DC offset according to claim 10 wherein said m-bit accumulator shifts said m-bit sum to said accumulating digital-to-analog converter upon receipt of said shift pulse from said p-bit synchronous counter.

12. The means for correction for DC offset according to claim 11 wherein said accumulating digital-to-analog converter converts said m-bit sum at the end of said sampling period, said accumulating digital-to-analog converter accumulates said m-bit sum for a predetermined number of sampling periods.

13. The means for correction for DC offset according to claim 12 wherein said inversion means is an inverting amplifier, said inverting amplifier has a gain, G, given by $$G = -R_f/R_i,$$

where $R_f$ is a feedback resistance and $R_i$ is an input resistance, said gain is selected to be equal to one over the predetermined number of samples of said predetermined number of least significant bits.

14. The means for correction for DC offset according to claim 13 wherein said inverting amplifier with gain G outputs said DC offset correction signal to said summing means.

15. The means for correction for DC offset according to claim 14 wherein said summing means adds said DC offset correction signal to said output of said analog switch, said summing means outputs a sum signal to said analog-to-digital converter.

16. The means for correction for DC offset according to claim 15 wherein said sum signal is a DC offset corrected analog input signal to be digitized.

17. The means for correction for DC offset according to claim 16 wherein said sum signal is a DC offset corrected thermal noise calibration signal.

18. A digital integration method for fast, continuous correction for DC offset in an analog-to-digital converter during analog-to-digital converter off time, said method comprising the step of:

(a) switching a thermal noise grounded input signal into said analog-to-digital converter;

(b) switching a n-bit output of said analog-to-digital converter to a m-bit accumulator;

(c) accumulating a predetermined number of least significant bits from said n-bit output of said analog-to-digital converter resulting in a m-bit sum;

(d) converting said m-bit sum into an analog correction signal; and (e) inverting the polarity of said analog correction signal which results in a DC offset correction signal 19. The method for fast, continuous correction according to claim 18 wherein said fast, continuous correction further includes the step of adding said DC offset correction signal to said thermal noise grounded input signal as part of an iterative cycle.

20. The method for fast, continuous correction according to claim 19, wherein said fast, continuous correction still further includes the step of adding said DC offset correction signal to an analog signal to be digitized upon completion of said iterative cycle.

21. The method for fast, continuous correction according to claim 20 wherein said step of switching said thermal grounded input signal into said analog-to-digital converter is accomplished by the reception of a calibrate control signal.

22. The method for fast, continuous correction according to claim 21 wherein said step of switching said n-bit output of said analog-to-digital converter to said m-bit accumulator is accomplished by the reception of said calibrate control signal.

23. The method for fast, continuous correction according to claim 22 wherein said step of accumulating a predetermined number of least significant bits includes the steps of:
  (a) summing a predetermined number of samples of said predetermined number of least significant bits in a predetermined sampling period resulting in said m-bit sum;
  (b) counting said predetermined number of samples being accumulated by said m-bit accumulator utilizing a counter; and
  (c) shifting said m-bit sum into an accumulating digital-to-analog converter upon receipt of a shift pulse from said counter.

24. The method for fast, continuous correction according to claim 23 wherein said step of converting said m-bit sum into an analog correction signal includes accumulating a plurality of m-bit sums as part of said iterative cycle and subsequently converting an accumulated sum into said analog correction signal.

25. The method for fast, continuous correction according to claim 24 wherein said step of inverting the polarity of said analog correction signal further includes dividing said analog correction signal by said predetermined number of samples.

* * * * *

UNITED STATES PATENT AND TRADEMARK OFFICE
CERTIFICATE OF CORRECTION

PATENT NO. : 4,972,189

DATED : November 20, 1990

INVENTOR(S) : Bruno Polito, et al.

It is certified that error appears in the above-identified patent and that said Letters Patent is hereby corrected as shown below:

Column 2, line 19: conversions The" should read as --conversions. The--

Column 3, line 2: "o+a" should read as --of a--

Column 3, line 8: "means The" should read as --means. The--

Column 5, line 11: "64 The" should read as --means. The--

Column 5, lines 25 & 26: "iterations As" should read as --iterations. As--

Column 6, line 10: "signal This" should read as --signal. The--

Column 6, line 64: "systems This" should read as --systems. This--

Signed and Sealed this

Twenty-eighth Day of April, 1992

*Attest:*

HARRY F. MANBECK, JR.

*Attesting Officer*      *Commissioner of Patents and Trademarks*